(12) United States Patent
Cox et al.

(10) Patent No.: US 7,119,874 B2
(45) Date of Patent: Oct. 10, 2006

(54) LITHOGRAPHIC APPARATUS AND DEVICE MANUFACTURING METHOD

(75) Inventors: Henrikus Herman Marie Cox, Eindhoven (NL); Sjoerd Nicolaas Lambertus Donders, 'S-Hertogenbosch (NL); Christiaan Alexander Hoogendam, Veldhoven (NL); Aleksey Yurievich Kolesnychenko, Helmond (NL); Erik Roelof Loopstra, Heeze (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/873,647

(22) Filed: Jun. 23, 2004

(65) Prior Publication Data

US 2005/0018155 A1 Jan. 27, 2005

(30) Foreign Application Priority Data

Jun. 27, 2003 (EP) ................................. 03254078

(51) Int. Cl.
G03B 27/52 (2006.01)
G03B 27/42 (2006.01)

(52) U.S. Cl. .......................................... 355/30; 355/53
(58) Field of Classification Search .................. 355/30, 355/53, 72–76; 359/820
See application file for complete search history.

(56) References Cited

U.S. PATENT DOCUMENTS

| 3,573,975 | A | 4/1971 | Dhaka et al. ................ 117/212 |
| 3,648,587 | A | 3/1972 | Stevens .......................... 95/44 |
| 4,346,164 | A | 8/1982 | Tabarelli et al. ............. 430/311 |
| 4,390,273 | A | 6/1983 | Loebach et al. ............. 355/125 |
| 4,396,705 | A | 8/1983 | Akeyama et al. ............ 430/326 |
| 4,480,910 | A | 11/1984 | Takanashi et al. ............ 355/30 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Henry Hung Nguyen
(74) *Attorney, Agent, or Firm*—Pillsbury Winthrop Shaw Pittman LLP (57) ABSTRACT

A lithographic projection apparatus wherein a liquid supply system provides a space between a projection system and a substrate with liquid. The liquid supply system comprises a member. A liquid seal is formed between the member and the substrate by a flow of liquid. In an embodiment, the liquid seal is formed by a flow of liquid from an inlet to an outlet of the member.

48 Claims, 7 Drawing Sheets

U.S. PATENT DOCUMENTS

| | | | |
|---|---|---|---|
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A * | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,560,032 B1 | 5/2003 | Hatano | 359/656 |
| 6,600,547 B1 | 7/2003 | Watson et al. | |
| 6,603,130 B1 | 8/2003 | Bisschops et al. | 250/492.1 |
| 6,633,365 B1 | 10/2003 | Suenaga | 355/53 |
| 6,867,844 B1 * | 3/2005 | Vogel et al. | 355/30 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0119954 A1 | 6/2004 | Kawashima et al. | 355/30 |
| 2004/0125351 A1 | 7/2004 | Krautschik | 355/53 |
| 2004/0263809 A1 | 12/2004 | Nakano | |
| 2006/0114435 A1 * | 6/2006 | Hazelton et al. | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 01/84241 A1 | 11/2001 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090633 | 10/2004 |
| WO | WO 2004/090634 | 10/2004 |
| WO | WO 2004/092833 | 10/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, "The $k_3$coefficient in nonparaxial λ/NA scaling equations for resolution, depth of focus, and immersion lithography," *J. Microlith., Microfab., Microsyst.* 1(1):7-12 (2002).

European Search Report for European Application No. 03 25 4078.3, dated Jun. 4, 2004.

Search Report for European Application No. 04253817.3, dated Nov. 23, 2004.

\* cited by examiner

LITHOGRAPHIC APPARATUS AND DEVICE MANUFACTURING METHOD

This application claims priority from European patent application EP 03254078.3, filed Jun. 27, 2003, which is incorporated herein in its entirety.

FIELD

The present invention relates to a lithographic projection apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid to be accelerated during a scanning exposure. This requires additional or more powerful motors and turbulence in the liquid may lead to undesirable and unpredictable effects.

Figure 2:
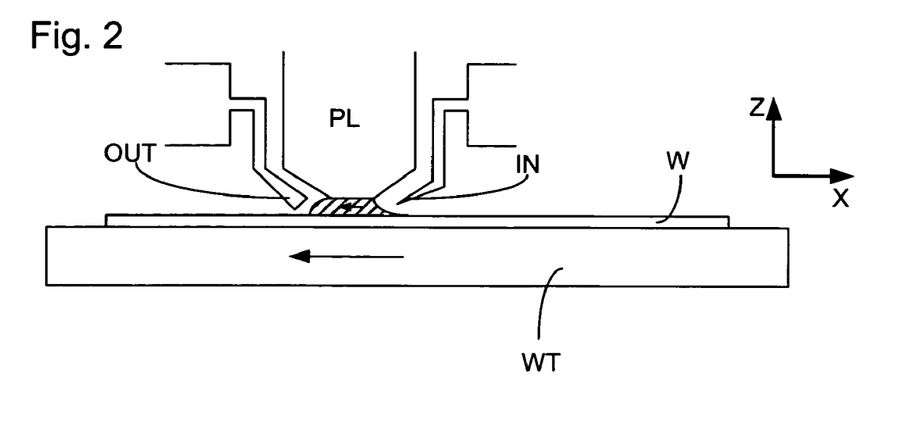
FIG. 2 depicts a cross section of a liquid supply system which provides liquid in a localized area.
Figure 3:
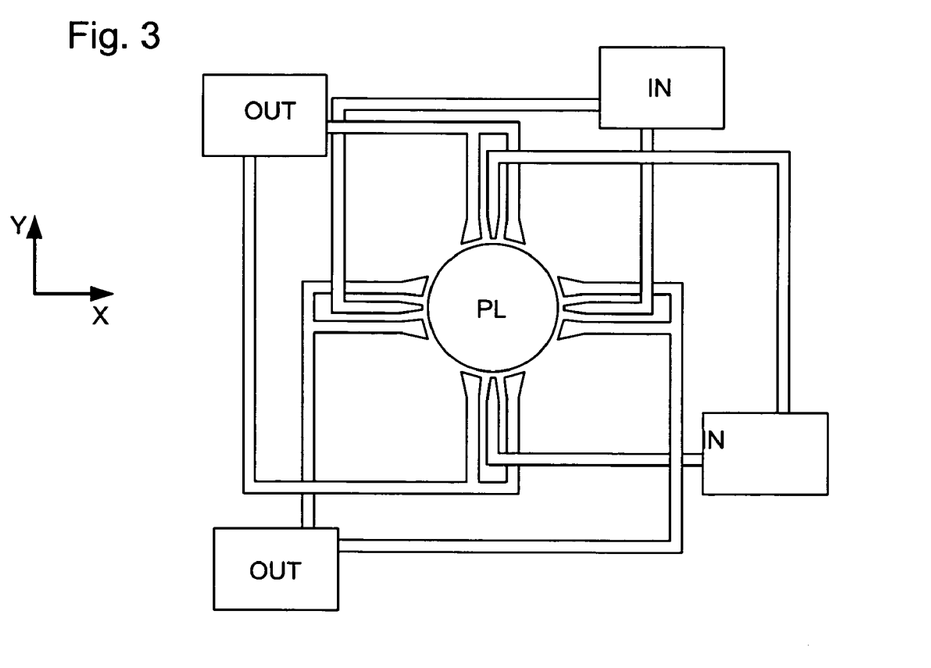
FIG. 3 is a plan view of the liquid supply system of FIG. 2.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Figure 4:
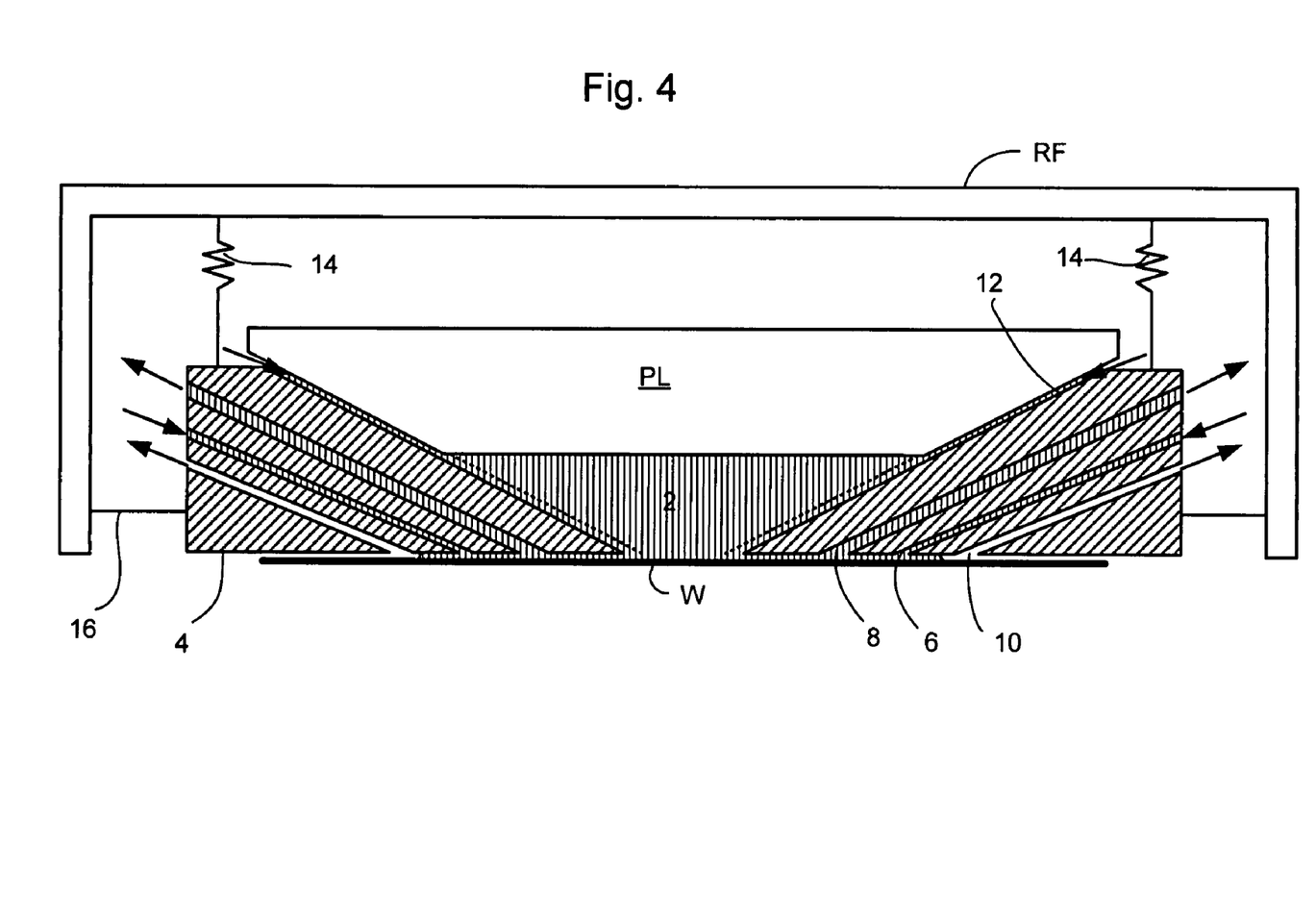
FIG. 4 depicts a cross section of a liquid supply system according to a first embodiment of the invention.

Another liquid supply system which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

In European Patent Application No. 03257072.3 the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

While a gas seal may seal the liquid effectively, it may present further problems. A relatively high gas pressure is used (with overpressure or gauge pressure relative to the environment of typically 100–10000 Pa) and this combined with relatively low damping of a gas seal device may mean that vibrations transmitted through the gas seal could cause an adverse effect on the performance of an imaging system. The vibrations due to pressure disturbances may cause servo errors of between 1 to 20 nm in the vertical direction and 1–50 nm horizontally.

Accordingly, it would be advantageous, for example, to provide an effective seal to contain the liquid in a space between the projection system and the surface of a substrate being imaged.

According to an aspect, there is provided a lithographic projection apparatus comprising:

an illumination system arranged to condition a radiation beam;

a support structure configured to hold a patterning device, the patterning device being capable of imparting the radiation beam with a pattern;

a substrate table configured to hold a substrate;

a projection system arranged to project the patterned radiation beam onto a target portion of the substrate;

a liquid supply system configured to provide a liquid to a space between the projection system and the substrate, the liquid supply system comprising a member extending along at least part of the boundary of the space; and a liquid seal device configured to form a liquid seal between the member and the substrate.

A liquid seal device configured to form a liquid seal between the member and the substrate may have an advantage that no gas supply may be needed. Therefore, bubbles due to the gas supply may be avoided in the liquid. Also, a liquid seal may be operative to retain the liquid in the space and to prevent the inclusion of gas from the environment of the apparatus which surrounds the substrate table. The liquid also may have good damping characteristics, which may reduce the transmission of disturbances (e.g. from the supply and removal of liquid) through the seal. Additionally, the construction of a liquid seal may be simplified because there may be no need to provide a gas inlet to the seal as there is with a gas seal. Furthermore, a liquid seal may be effective with a smaller volume and/or a greater gap height than a corresponding gas seal. A greater gap height may impose less strict mechanical specifications on the substrate, substrate table and member.

Optionally, the liquid seal device comprises either a hydrostatic or hydrodynamic bearing configured to support the member above the surface of the substrate. The provision of a hydrostatic or hydrodynamic bearing for both support and sealing allows the seal to function over a larger gap range, for example up to 1 mm, in an embodiment, in the range of 10 to 300 µm. The bearing may have stiffness and damping in 3 degrees of freedom: in the vertical (Z) direction, and rotation about axes perpendicular to the Z direction. It may therefore also function as suspension for the member.

Optionally, the pressure of the liquid in the hydrostatic bearing is in the range of 100 Pa to 100 kPa relative to the ambient pressure. Ambient pressure refers to pressure in the apparatus surrounding the liquid filled space. If the bearing pressure is in this range, the bearing may function as suspension for the member and transmit fewer vibrations than a comparable gas seal.

Optionally, the member further comprises a shared liquid outlet configured to remove liquid from the space and from the liquid seal device. Construction of an immersion lithograph apparatus may be simplified by providing a shared liquid outlet for both the liquid seal device and the liquid filled space.

Optionally, the shared liquid outlet is on a surface of the member which faces the substrate and is positioned between the space and the liquid seal device. The liquid in the seal will generally be at a higher pressure than the liquid in the space and therefore this pressure gradient may facilitate that liquid supplied to the seal moves radially inwards towards the optical axis, improving the effectiveness of the seal.

Optionally, the shared liquid outlet has a cross sectional area in a plane substantially parallel to the substrate which is greater than the cross sectional area of a liquid inlet. The greater cross-sectional area may allow the flow in the outlet to be laminar. This may reduce turbulence in the liquid filling the space, the turbulence possibly having an adverse and chaotic effect on accuracy.

According to a second aspect, there is provided a lithographic projection apparatus comprising:

an illumination system arranged to condition a radiation beam;

a support structure configured to hold a patterning device, the patterning device being capable of imparting the radiation beam with a pattern;

a substrate table configured to hold a substrate;

a projection system arranged to project the patterned radiation beam onto a target portion of the substrate;

a liquid supply system configured to provide a liquid to a space between the projection system and the substrate, the liquid supply system comprising a member extending along at least part of the boundary of the space, wherein the member comprises a liquid inlet located on a surface of the member which faces the substrate.

Positioning of a liquid inlet on a surface of the member may allow liquid to flow in an inward radial direction towards the liquid filled space. This may reduce the flow of liquid in an outward radial direction and provide a more effective seal.

Optionally, the height of the member above the surface of a substrate is greater in a region between the space and the liquid inlet than elsewhere. By varying the height in this way, the pressure of liquid supplied may be reduced for the same rate of refreshment of liquid in the space. This may reduce the transmission of unwanted vibrations. It also may reduce the flow of liquid in an outward radial direction. This is beneficial because liquid flowing in this direction should be removed and removing a large amount, e.g. by vacuum suction, may induce unwanted vibrations in the apparatus.

Optionally, the liquid supply system further comprises a gas seal device positioned outwards in a radial direction from the liquid inlet, configured to form a gas seal between the member and the surface of the substrate.

Optionally, the member further comprises an intermediate gas inlet and a liquid outlet respectively positioned outwards in a radial direction from the liquid inlet and both located on the surface of the member which faces the substrate. A liquid outlet can remove liquid which might otherwise leak in an outward radial direction. An intermediate gas inlet may enhance the removal of the liquid at the liquid outlet.

Optionally, the height of the member above the surface of the substrate is greater between the intermediate gas inlet and the liquid outlet than between the liquid inlet and the intermediate gas inlet. A height variance may improve the removal of liquid at the liquid outlet.

Optionally, in the above first or second aspects, the liquid supply system further comprises a low pressure outlet configured to prevent leakage of liquid in an outward radial direction, the low pressure outlet located on a surface of the member which faces the substrate. A low pressure outlet may remove any liquid which leaks from the seal and stop it from encroaching into the rest of the apparatus.

Optionally, the apparatus of the above first or second aspects further comprises a bias device configured to apply a biasing force to the member that is directed towards the surface of the substrate. By applying a biasing force to the member that is directed towards the substrate, the force that may be needed to support the member can be adjusted as desired. If the liquid seal is a hydrostatic bearing, this may allow the steady state operating pressure of the bearing to be adjusted without adjusting the dimensions of the bearing.

Optionally, the apparatus of the above first or second aspect further comprises a support member, connected between the member and a machine frame, configured to support the member. A support member may allow the position of the member to be maintained in a correct position relative to the projection system and may also provide support and suspension for the member.

Optionally, in the apparatus of the above first or second aspects, the member comprises a liquid inlet, a liquid outlet and a combined outlet for both liquid and gas.

Optionally, in the apparatus of the above first or second aspects, the liquid supply system is configured to supply liquid to the space at a rate of 0.1 to 10 liters per minute.

Optionally, in the apparatus of the above first or second aspects, the liquid supply system is configured to supply liquid to the space at a pressure which compensates for liquid transported away from the space by relative movement between the substrate and the member. This may avoid inclusion of gas into the liquid due to relative movement between the substrate and the member.

Optionally, the apparatus of the above first or second aspects further comprises a chamber formed upstream of an inlet of the member, downstream of an outlet of the member, or both. A chamber may facilitate even, homogenous flow of liquid and/or gas to be achieved.

Optionally, the apparatus of the above first or second aspects further comprises:

a sensor configured to establish a position of the member; and a controller configured to control an actuator based on the position established by the sensor.

This may allow the position of the member above the surface of the substrate to be controlled, in an embodiment, with 3 degrees of freedom, and in an embodiment with 6 degrees of freedom. In an embodiment, the controller is configured to control the actuator to maintain a desired distance between the surface of the substrate and the member. In an embodiment, the controller may also generate a large electronic damping of the member resulting in a design that is less sensitive to vibrations from the liquid supply system. The controller may also be used to effect a real-time monitoring of the quality of a seal, allowing rapid action (e.g. retraction of the member) in the case of a system failure or error. The controller may be configured to control the actuator to at least partly compensate for an external force on the member. Such a force may originate from gravity, liquid transport tubing, or from a guidance system for the member.

Optionally, in the apparatus of the above first or second aspects, an inlet of the member, an outlet of the member, or both has rounded edges. By rounded it is meant that the edge is not square, rounded accordingly includes arcuate and curved profiles. The degree of curvature depends on the dimensions of the inlet/outlet. In an embodiment, the radius of curvature is in the range of 0.1 mm to 5 mm. Rounded edges may improve the flow around the edge and reduce turbulence.

Optionally, in the apparatus of the above first or second aspects, an edge of the member adjacent to a surface of the substrate is rounded. By rounded it is meant that the edge is not square, rounded accordingly includes arcuate and curved profiles. In an embodiment, the radius of curvature is in the range of 0.1 mm to 15 mm.

According to a third aspect, there is provided a device manufacturing method comprising:

providing a liquid to a space between a projection system of a lithographic apparatus and a substrate, the space being bounded at least in part by a member;

forming a liquid seal between the substrate and the member; and projecting a patterned radiation beam, using the projection system, through the liquid onto a target portion of the substrate.

According to a fourth aspect, there is provided a device manufacturing method comprising:

providing a liquid to a space between a projection system of a lithographic apparatus and a surface of the substrate, the liquid being provided via a liquid inlet provided on a member, the liquid inlet facing the surface of the substrate; and projecting a patterned radiation beam, using the projection system, through the liquid onto a target portion of the substrate.

In an embodiment, the methods of the third or fourth aspects, further comprise:

establishing a distance between a surface of the substrate and the member; and controlling an actuator to maintain a desired distance between the surface of the substrate and the member based on the established distance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the Figures, corresponding reference symbols indicate corresponding parts.

DETAILED DESCRIPTION

Embodiment 1

Figure 1:
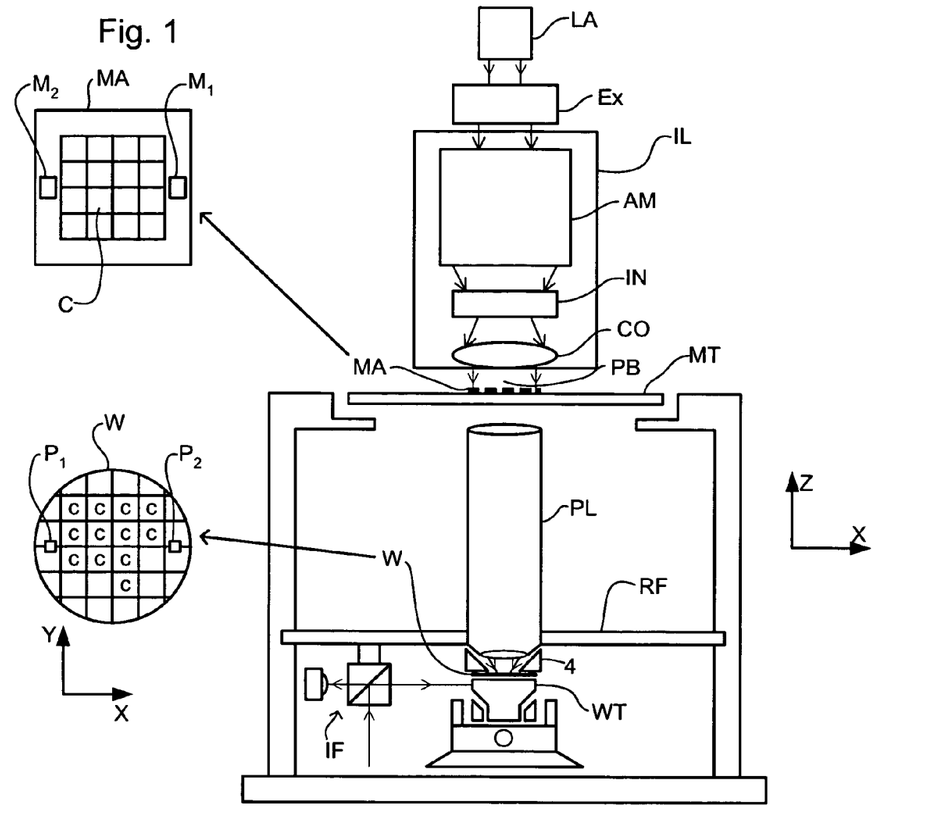
FIG. 1 depicts a lithographic projection apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation radiation).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

FIG. 4 illustrates a liquid supply system according to the first embodiment of the present invention. A liquid fills a space 2 between a final element of the projection system PL and the substrate W. A seal member 4 is arranged between the final element of the projection system PL and the surface of the substrate W to define the space 2. A liquid seal is formed between the seal member 4 and the surface of the substrate W to prevent leakage of liquid from the space 2.

The seal member 4 has a liquid inlet 6 and a liquid outlet 8 in its surface which faces the substrate (hereinafter referred to as the primary surface). The outlet 8 is located radially inward of the inlet 6 with respect to the optical axis of the projection system. A liquid seal is formed by the flow of liquid from the inlet 6 to the outlet 8. In an embodiment, the liquid seal is formed by a hydrostatic bearing defined by the flow of liquid from the inlet 6 to the outlet 8. This hydrostatic bearing can then support the seal member 4 as well as provide a liquid seal to prevent leakage of the liquid from the space 2.

A vacuum outlet 10 is also formed in the primary surface of the seal member 4, outwards in a radial direction from the inlet 6 with respect to the optical axis, for extracting any liquid which may escape from the seal into the area of the substrate W not immersed in liquid.

An additional liquid inlet 12 is formed in the gap between the final element of the projection system PL and the upper surface of the seal member 4. This additional inlet 12 is used to supply liquid into the space 2. In this embodiment the liquid is primarily distilled water, although other liquids can also be used.

FIG. 4 depicts the seal member in cross section. It will be appreciated that the inlets 6 and 12 and the outlets 8 and 10 can extend continually around the liquid filled space 2, forming a groove when viewed from the surface of the substrate. This groove can be annular, rectangular or polygonal. Alternatively the inlets and outlets can be provided at discrete locations in a continuous groove and not extend continuously around the length of the groove.

An additional horizontal member 16 connects the seal member 4 to the sides of a reference frame RF. This member provides support for the seal member in addition to the bearing and also ensures that a correct horizontal position is maintained. It keeps the seal member 4 substantially stationary with respect to the projection system PL in the horizontal, XY plane, but allows relative movement in the vertical, Z, direction and tilts in the vertical plane.

In use, the outlet 8 is maintained at a lower pressure than the inlet 6 and therefore liquid will flow from the inlet 6 to the outlet 8. This creates a liquid seal to contain the liquid in the space 2. An additional benefit is that this flow of liquid radially inwards forms a hydrostatic bearing which can support the sealing member 4. A further benefit is that in an emergency the liquid 2 can be rapidly removed via outlet 8 to prevent damage to the apparatus.

However, some liquid may "leak" radially outwards from the hydrostatic bearing into the rest of the apparatus. The vacuum system 10 removes this leaking liquid and also help to remove any liquid left adhering to the substrate W when the substrate W moves relative to the seal member 4.

The flow of liquid into the space 2 via the inlet 12 is advantageously a very laminar flow (i.e. with a Reynolds number of much less than 2300). Likewise the flow of liquid through the outlet 8 is also, in an embodiment, a laminar flow. This ensures that there is no turbulence in the liquid filling the space 2 and that there are no disturbances to the optical path through the liquid. The outlet 8 is responsible for removing the liquid supplied from both the inlet 12 for the space and the inlet 6 for the bearing. Therefore, the cross-sectional area of the outlet 8 is larger than that of the inlet 12 to ensure that flow is laminar.

Adjustable passive springs 14 apply a biasing force to the seal member 4 in the direction of the substrate W. This biasing force allows the operating pressure of the hydrostatic bearing to be altered without needing to alter the dimensions of the bearing. The force exerted by the hydrostatic bearing matches the force exerted downwards due to gravity on the bearing and is equal to the pressure multiplied by the effective surface area over which the bearing acts. Therefore, if a different operating pressure is desired, either the effective area of the bearing should be changed or the force that the bearing supports should be changed. Although in this embodiment a bias device such as a spring 14 has been used to provide the biasing force, other bias devices may also be appropriate, for example, using an electromagnetic force.

The height of the seal member 4 above the substrate W is adjustable between 10 and 500 µm according to the surface variations of the substrate W (and therefore the liquid flow) to be accommodated. In this embodiment, the gap is increased or decreased by altering the pressure of the hydrostatic bearing such that the seal member 4 moves relative to the substrate W. The pressure of the hydrostatic bearing is then returned to the equilibrium pressure when the correct position has been reached. An alternative method of varying the gap distance could make use of the springs 14. As the distance between the seal member 4 and the reference frame RF is varied, the force exerted by the springs 14 will also vary. This means that the height of the seal member 4 above the substrate W may be adjusted by simply adjusting the operating pressure of the bearing.

A typical operating pressure of the hydrostatic bearing is between 100 Pa and 100 kPa overpressure relative to the environment. In an embodiment, the operating pressure is 3 kPa. Operation at this pressure allows the bearing to support the seal member 4 effectively and also provide some suspension. The bearing will have stiffness in the vertical direction and also for rotations about axes perpendicular to the vertical direction.

In this embodiment, the same liquid is supplied to both the inlet 12 for the space and the inlet 6 for the bearing. This allows a common outlet 8 to be used without needing to consider the effects of mixing of two liquids, and possible diffusion from the liquid in the hydrostatic bearing into the liquid filled space 2. However, it need not be the same liquid and a different liquid can be supplied to the inlet 12 for the space and to the inlet 6 for the bearing.

Although this embodiment has described as having the inlets and outlets on a surface of the seal member which faces the substrate, this does not have to be the case and other arrangements are possible.

While the use of a hydrostatic bearing has been described, a hydrodynamic bearing could also be used.

Embodiment 2

Figure 5:
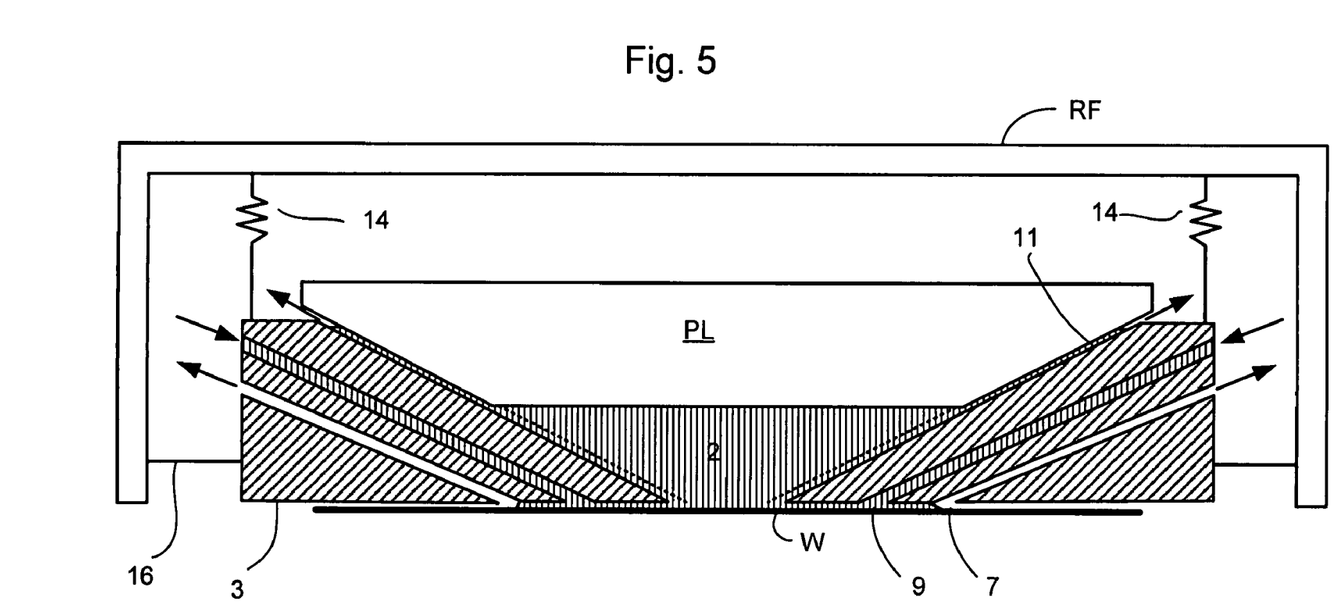
FIG. 5 depicts a cross section of a liquid supply system according to a second embodiment of the invention.

A cross section of a liquid supply system according to a second embodiment of the invention is shown in FIG. 5. The construction of this embodiment is the same as for the first embodiment, save as described below.

In this embodiment a seal member 3 has a single liquid inlet 9. The inlet 9 is located outwards in a radial direction with respect to the optical axis from a liquid filled space 2 between the final element of the projection system PL and the surface of the substrate W. Liquid supplied by the inlet 9 flows both inwards, into the space 2, and outwards towards an outlet 7. The outlet 7 is connected to a low pressure source. The low pressure source causes the liquid to be sucked into the outlet 7 and prevented from entering the rest of the apparatus. A further outlet 11 is provided between the seal member 3 and the projection system PL to remove liquid from the space 2.

In an embodiment, the flow of liquid in the inlet 9 and outlet 11 is a laminar flow to reduce turbulence. Turbulence in the liquid can have an adverse effect on the imaging process.

The construction of this embodiment is simplified over the above described first embodiment because only a single liquid inlet is provided.

Embodiment 3

Figure 6:
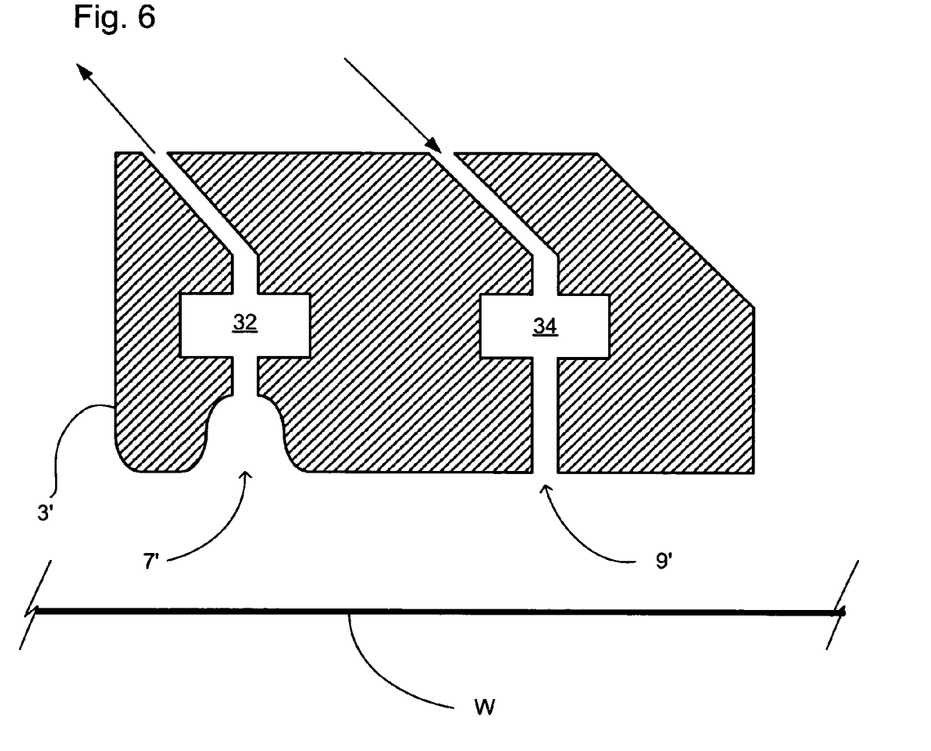
FIG. 6 depicts a cross section of a seal member according to a third embodiment of the present invention.

A cross section of a seal member according to a third embodiment of the present invention is shown in FIG. 6. The construction of this embodiment is the same as for the second embodiment, save as described below.

A seal member 3' has a liquid inlet 9' and an outlet 7' which is connected to a low pressure source. The edges of the outlet 7' which face the surface of the substrate W are rounded, as is the edge of the seal member 3' adjacent to the outlet 7'. The rounded edges can have the form of an arc or an arbitrary curved profile. The degree of curvature depends on the dimensions of the inlet/outlet. In this embodiment, the radius of curvature is in the range of 0.1 mm to 5 mm. The rounded edges improve the flow around the edge and reduce turbulence. By replacing the square edges with rounded edges in this manner, the flow of gas and/or liquid through the outlet 7' is improved.

To further improve the flow through the outlet 7', a duct or chamber 32 is provided within the seal member in the outlet 7'. This chamber 32 may ensure that a homogeneous low pressure source is provided.

A chamber 34 is also provided in the liquid inlet 9'. This chamber 34 may ensure that an even, homogeneous supply of liquid is achieved.

FIG. 6 depicts the seal member 3' in cross section. It will be appreciated that the chambers 32 and 34 can extend continuously throughout the seal member or be located at discrete radial locations.

Although this embodiment has described as both rounding the edges of the outlet 7' and providing chambers 32 and 34, either of these features could be provided independently of each other if desired. Likewise, the rounding and ducts of this embodiment may be applied to the seal member of the first embodiment described above, and to seal members having different configurations of inlets and outlets.

Embodiment 4

Figure 7:
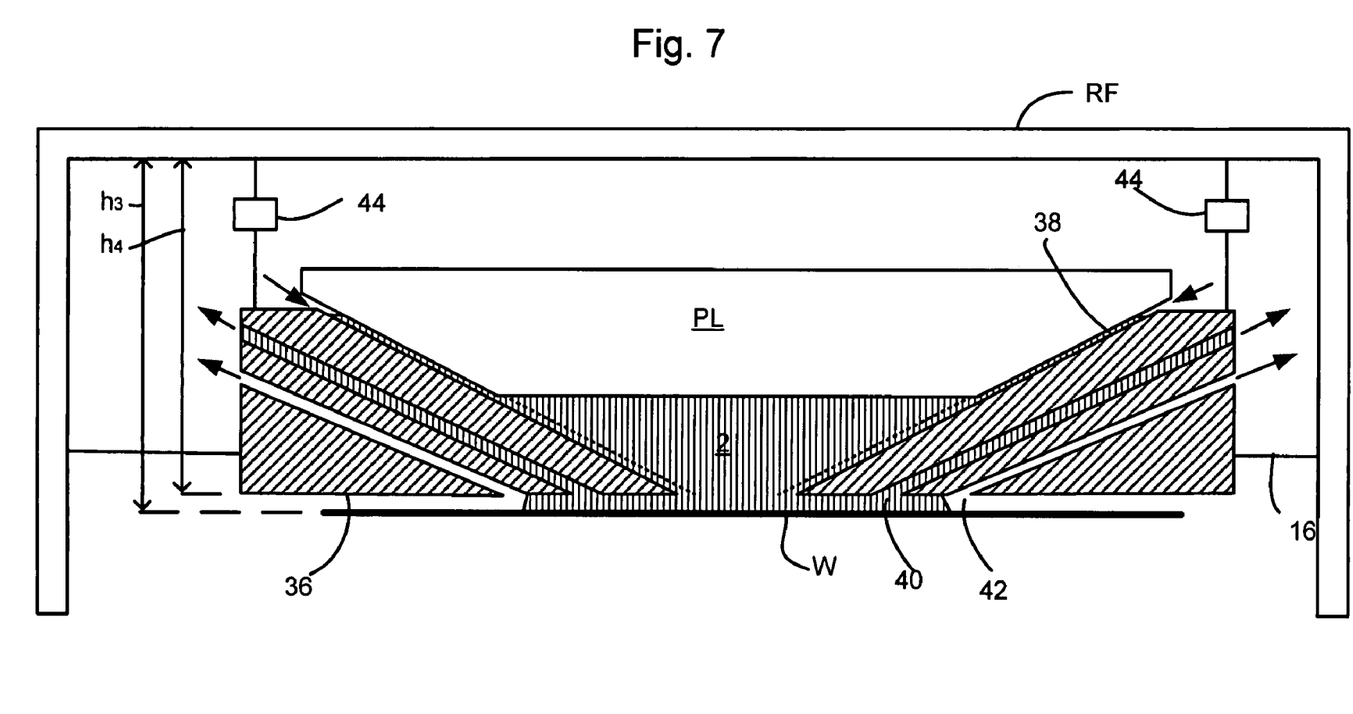
FIG. 7 depicts a cross section of a liquid supply system according to a fourth embodiment of the present invention.

A cross section of a liquid supply system according to a fourth embodiment of the present invention is depicted in FIG. 7. The construction of this embodiment is the same as for the first embodiment, save as described below.

A seal member 36 delimits a space 2 between the projection system PL and the surface of the substrate W. Liquid is supplied to fill the space 2 formed between the final element of the projection system PL and the seal member 36 via an inlet 38. A liquid outlet 40 is formed in the surface of the seal member 36 which faces the substrate W (hereinafter referred to as the primary surface) and is located outwards in a radial direction from the optical axis of the projection system PL. This outlet 40 removes liquid from the space 2. In an embodiment, the flow of liquid in the inlet 38 and outlet 40 is a laminar flow. This avoids turbulence in the liquid filling the space 2, the turbulence possibly having an adverse effect on the imaging quality.

A further outlet 42 is formed in the primary surface of the seal member 36 outwards in a radial direction from the liquid outlet 40 and is connected to a low pressure source. This ensures that any liquid which is not removed by the liquid outlet 40 cannot "leak" into the remainder of the apparatus.

The seal member 36 is connected to a reference frame RF by a plurality of Lorentz actuators 44. In an embodiment, three such Lorentz actuators 44 are provided, only two of which are shown in FIG. 7. These actuators 44 are controlled by a controller to set the vertical position of the seal member 36 above the substrate W.

The controller takes an input of the distance $h_3$ between the surface of the substrate W and the reference frame RF and the distance, $h_4$, between the primary surface of the seal member 36 and the reference frame RF. These distances are measured by sensors (not shown). The controller can therefore calculate the height of the seal member 36 above the surface of the substrate W by subtracting $h_4$ from $h_3$. It then uses, for example, proportional, integral and derivative (PID) feedback control to control the actuators 44 so that the seal member is the correct height above the substrate. Other methods of control are also suitable. For example, the control of the seal member relative to the substrate can be preformed indirectly using only the height, $h_4$, of the seal member relative to the reference frame.

The distance between the substrate and the seal member is adjustable up to 2 mm, during exposure and up to 10 mm during mechanic start up on maintenance. The controller can control the seal member 36 with 3 degrees of freedom: displacement in the Z direction (parallel to the optical axis of the projection system PL) and rotations about axes perpendicular to the Z direction.

The seal member 36 is supported above the substrate W by the actuators 44. There is no need for a stiff connection between the substrate W and the seal member 36. Lack of stiff connection reduces the transmission of vibrations to the seal member 36 and simplifies the dynamics of the control of the substrate W in the Z direction.

Accordingly, the system of this embodiment can easily control the height of the seal member 36 above the surface of the substrate W to accommodate wide variations in the surface height of the substrate.

Although the use of Lorentz actuators 44 has been described, other types of actuator are also suitable, for example electromagnetic, piezo or pneumatic actuators.

The controller may also be used to:
effect active position measurement and control of the seal member with respect to the substrate to guarantee seal-functionality;
damp the seal member with respect to the substrate to reduce the impact of disturbance generated in the seal member, e.g. vacuum fluctuations;
gravity compensation, e.g. in combination with a gas-bearing that has a pre-tension by vacuum force;
generate extra pre-tension forces, e.g. in combination with a liquid bearing;
compensate for other external forces and moments, e.g. due to hose connections or fixation members in non-actuated directions; and
provide actuated movement for general purposes, e.g. during substrate loading or maintenance.

It will be appreciated that the controller of this embodiment can be applied to the other embodiments described above.

Embodiment 5

Figure 8:
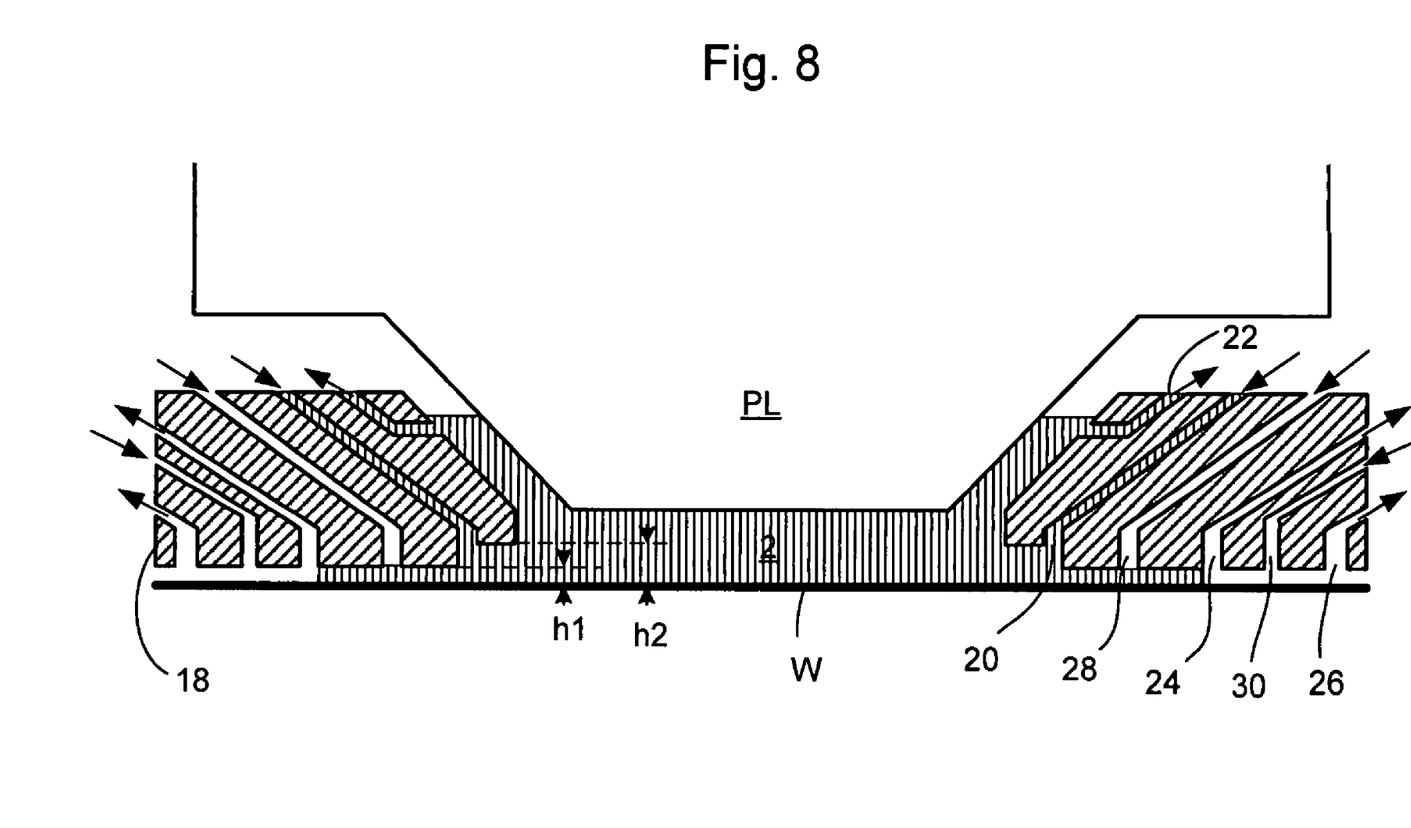
FIG. 8 depicts a cross section of a liquid supply system according to a fifth embodiment of the present invention.

A liquid supply system according to a fifth embodiment of the invention is illustrated in FIG. 8. The construction of this embodiment is the same as for the first embodiment, save as described below.

A seal member 18 surrounds the final element of the projection system PL to define a space 2 which is filled with a liquid. In this embodiment the liquid is primarily distilled or purified water, although other liquids may also be used. Pressurized liquid is supplied to the space 2 by an inlet 20 formed on the surface of the seal member 18 which faces the substrate W (hereinafter referred to as the primary surface).

The liquid is removed at two locations. An upper outlet 22 removes liquid from near the top of the space 2. A lower outlet 24, formed in the primary surface of the seal member 4, removes liquid from the surface of the substrate W. Pressurized gas is supplied to two locations on the primary surface of the seal member 18 to ensure that the liquid remains in the space 2. A first gas inlet 28 is located radially inwards of the lower outlet 24 with respect to the optical axis of the projection system. It limits the flow of liquid to the lower outlet 24 by restricting the area available for the liquid to flow through to reach the lower outlet 24 and also decouples the pressure at inlet 20 from the pressure at lower outlet 24.

A low pressure or vacuum is maintained at the lower outlet 24 to suck liquid away as well as gas from the first gas inlet 28 and a second gas inlet 30. The flow of gas from the first gas inlet 28 to the lower outlet 24 enhances the liquid removal. The flow of gas from the second inlet 30 to lower outlet 24 is effective to create a gas seal. The gas supplied at the inlet 30 will also function to some extent as a gas bearing to help to support the seal member 18, and as a gas jet, to assist in confining the immersion liquid.

A low pressure or vacuum is also maintained at a third outlet 26, located radially outwards from the lower outlet 24 with respect to the optical axis of the projection system. The third outlet 26 acts to remove gas from second gas inlet 30 and to keep such gas from reaching the remainder of the apparatus.

FIG. 8 depicts the seal member 18 in cross section. It will be appreciated that the inlets 20, 28 and 30 and the outlets 22, 24 and 26 can extend continually around the liquid filled space 2, forming a groove when viewed from the surface of the substrate. This groove can be annular, rectangular or polygonal. Alternatively, the groove can extend continually around the liquid filled space 2, but the inlets and outlets can only be present at discrete positions in the groove, not continuously along its length.

Liquid is supplied at the inlet 20 for at least two reasons. Firstly, it refreshes the liquid in the space 2 and allows the temperature and level of contaminants to be controlled. Secondly, it reduces gas inclusion. Gas inclusion can arise as the substrate W moves relative to the projection system PL, agitating the liquid and transporting it away from the space 2. The pressure needed to supply the liquid to meet these two criteria is calculated by two different formulas.

To avoid gas inclusion, the pressure needed is:

$$\Delta p = \frac{6nv\eta}{h_1} \qquad (1)$$

Where n is a safety factor of the order of 10, v is the scanning velocity, $\eta$ is the viscosity of the liquid and $h_1$, is the height of the primary face of the seal member above the surface of the substrate between inlet 20 and inlet 28. For water, with typical values of v=0.5 m/s and $h_1$=30 µm the relative pressure needed is approximately 1000 Pa, which is relatively low.

To refresh the liquid in the space 2, the pressure needed is:

$$\Delta p = \frac{6\Phi_{v,refresh} d_1 \eta}{\pi r h_2^3} \qquad (2)$$

Where $\Phi_{v,refresh}$ is the refreshment rate, $h_2$ is the height of the primary face of the seal member above the surface of the substrate between inlet 20 and the space 2 and $d_1$, is the distance between the inlet 20 and the inner radial edge of the seal member 18. For water, with a typical $\Phi_{v,refresh}$=1000 cm³/min, r=30 mm, $d_1$=3 mm and $h_2$=30 µm this gives a needed relative pressure of approximately 100 kPa, which is high for practical applications. However, the inverse cube relationship to $h_2$ means that if $h_2$ can be increased by a factor of 4, the pressure is reduced by a factor of 64 resulting in an acceptable pressure of approximately 1.5 kPa. Other factors can be used to increase $h_2$ as well, for example at least 1.5, 2 or 3 and at least 4 as described above.

Therefore, to reduce the pressure needed to refresh the liquid, the height $h_2$ of the seal member 18 above the surface of the substrate W is 120 µm only in the region between the liquid filled space 2 and the liquid inlet 20. The height $h_1$, of the other parts of the seal member 18 above the surface of the substrate W is 30 µm.

As well as reducing the pressure required to refresh the liquid this construction also reduces the excess liquid flow generated by the movement of the substrate W. This excess liquid flow is removed at the lower outlet 24. Removing liquid by the low pressure or vacuum at the outlet 24 may cause unwanted mechanical vibrations. Reducing the volume of liquid removed at the outlet 24 therefore reduces the chance of unwanted mechanical vibrations being generated.

The removal of liquid at the outlet 24 can be improved by making the height of the primary surface of the seal member 18 above the surface of the substrate W greater between the first gas inlet 28 and the outlet 24 than between the liquid inlet 20 and the first gas inlet 28 ($h_1$).

It will be appreciated that the dimensions given in this embodiment can be adjusted depending on the operating liquid pressure desired, or on the viscosity of the liquid used to fill the space 2.

Embodiment 6

Figure 9:
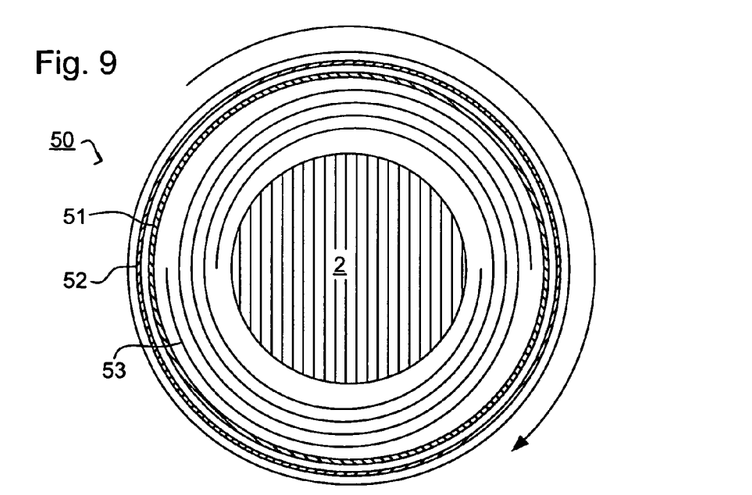
FIG. 9 depicts a seal member according to a sixth embodiment of the invention.

In a sixth embodiment of the invention, which may be the same as any of the above described embodiments, save as described below, an additional confinement of the liquid is effected by rotating part of the seal member.

As shown in FIG. 9, which depicts the seal member 50 from below, the seal member, or at least a lower part, is circular. A liquid inlet 51 in the shape of a ring is provided near the outer periphery of the seal member and a liquid outlet 52, again in the shape of a ring is provided outside the inlet 51. Inside the inlet 51, one or more spiral grooves 53 are provided on the lower surface of the seal member 50. When the seal member is rotated in the direction indicated, the grooves will effect a pumping action tending to urge the liquid towards the center of the seal member.

While specific embodiments of the invention have been described above, it will be appreciated that the invention may be practiced otherwise than as described. The description is not intended to limit the invention.

The invention claimed is:

1. A lithographic projection apparatus comprising:
    an illumination system arranged to condition a radiation beam;
    a support structure configured to hold a patterning device, the patterning device being capable of imparting the radiation beam with a pattern;
    a substrate table configured to hold a substrate;
    a projection system arranged to project the patterned radiation beam onto a target portion of the substrate;
    a liquid supply system configured to provide a liquid to a space between the projection system and the substrate, the liquid supply system comprising a member extending along at least part of the boundary of the space and a liquid seal device configured to supply a liquid between the member and the substrate to form a liquid seal.

2. Apparatus according to claim 1, wherein the liquid seal device comprises either a hydrostatic or a hydrodynamic bearing configured to at least partially support the member above a surface of the substrate.

3. Apparatus according to claim 2, wherein a pressure of the liquid in the hydrostatic or hydrodynamic bearing is in the range of 100 Pa to 100 kPa relative to an ambient pressure.

4. Apparatus according to claim 1, wherein the member further comprises a shared liquid outlet configured to remove liquid from the space and from the liquid seal device.

5. Apparatus according to claim 4, wherein the shared liquid outlet is located on a surface of the member which faces the substrate and is positioned between the space and the liquid seal device.

6. Apparatus according to claim 4, wherein the shared liquid outlet has a cross sectional area in a plane substantially parallel to the substrate which is greater than the cross sectional area of a liquid inlet.

7. Apparatus according to claim 1, wherein the liquid supply system further comprises a low pressure outlet configured to prevent leakage of liquid in an outward radial direction, the low pressure outlet located on a surface of the member which faces the substrate.

8. Apparatus according to claim 1, further comprising a bias device configured to apply a biasing force to the member that is directed towards a surface of the substrate.

9. Apparatus according to claim 1, further comprising a support member, connected between the member and a machine frame, configured to support the member.

10. Apparatus according to claim 1, wherein the member comprises a liquid inlet, a liquid outlet and a combined outlet for both liquid and gas.

11. Apparatus according to claim 1, wherein the liquid supply system is configured to supply liquid to the space at a rate of 0.1 to 10 liters per minute.

12. Apparatus according to claim 1, wherein the liquid supply system is configured to supply liquid to the space at a pressure which compensates for liquid transported away from the space by relative movement between the substrate and the member.

13. Apparatus according to claim 1, further comprising a chamber formed upstream of an inlet of the member, downstream of an outlet of the member, or both.

14. Apparatus according to claim 1, further comprising:
    a sensor configured to establish the position of the member; and
    a controller configured to control an actuator based on the position established by the sensor.

15. Apparatus according to claim 14, wherein the controller is configured to control the actuator to maintain a desired distance between a surface of the substrate and the member.

16. Apparatus according to claim 14, wherein the controller is configured to control the actuator to at least partly compensate for an external force on the member.

17. Apparatus according to claim 14, wherein the controller is configured to damp the member.

18. Apparatus according to claim 14, wherein the controller is configured to retract the member in the case of a system error.

19. Apparatus according to claim 14, wherein the seal comprises a hydrostatic or hydrodynamic bearing and the controller is configured to control the actuator to exert a pre-tension force on the bearing.

20. Apparatus according to claim 1, wherein an inlet of the member, an outlet of the member, or both has rounded edges.

21. Apparatus according to claim 1, wherein an edge of the member adjacent to a surface of the substrate is rounded.

22. A lithographic projection apparatus comprising:
    an illumination system arranged to condition a radiation beam;
    a support structure configured to hold a patterning device, the patterning device being capable of imparting the radiation beam with a pattern;
    a substrate table configured to hold a substrate;
    a projection system arranged to project the patterned radiation beam onto a target portion of the substrate;
    a liquid supply system configured to provide a liquid to a space between the projection system and the substrate, the liquid supply system comprising a liquid outlet and a member extending along at least part of the boundary of the space, wherein the member comprises a liquid inlet located on a surface of the member which faces the substrate, and wherein the liquid outlet is separate from the liquid inlet and adjacent each other on a same side of the projection system.

23. Apparatus according to claim 22, wherein a height of the member above a surface of the substrate is greater in a region between the space and the liquid inlet than elsewhere.

24. Apparatus according to claim 23, wherein the liquid supply system further comprises a gas seal device positioned outwards in a radial direction from the liquid inlet, configured to form a gas seal between the member and a surface of the substrate.

25. Apparatus according to claim 22, wherein the member further comprises an intermediate gas inlet, and said intermediate gas inlet and said liquid outlet respectively positioned outwards in a radial direction from the liquid inlet and both located on the surface of the member which faces the substrate.

26. Apparatus according to claim 25, wherein a height of the member above a surface of the substrate is greater between the intermediate gas inlet and the liquid outlet than between the liquid inlet and the intermediate gas inlet.

27. Apparatus according to claim 22, wherein the liquid supply system further comprises a low pressure outlet configured to prevent leakage of liquid in an outward radial direction, the low pressure outlet located on a surface of the member which faces the substrate.

28. Apparatus according to claim 22, further comprising a bias device configured to apply a biasing force to the member that is directed towards a surface of the substrate.

29. Apparatus according to claim 22, further comprising a support member, connected between the member and a machine frame, configured to support the member.

30. Apparatus according to claim 22, wherein the member comprises a combined outlet for both liquid and gas.

31. Apparatus according to claim 22, wherein the liquid supply system is configured to supply liquid to the space at a rate of 0.1 to 10 liters per minute.

32. Apparatus according to claim 22, wherein the liquid supply system is configured to supply liquid to the space at a pressure which compensates for liquid transported away from the space by relative movement between the substrate and the member.

33. Apparatus according to claim 22, further comprising a chamber formed upstream of an inlet of the member, downstream of an outlet of the member, or both.

34. Apparatus according to claim 22, further comprising:
a sensor configured to establish the position of the member; and
a controller configured to control an actuator based on the position established by the sensor.

35. Apparatus according to claim 34, wherein the controller is configured to control the actuator to maintain a desired distance between a surface of the substrate and the member.

36. Apparatus according to claim 34, wherein the controller is configured to control the actuator to at least partly compensate for an external force on the member.

37. Apparatus according to claim 34, wherein the controller is configured to damp the member.

38. Apparatus according to claim 34, wherein the controller is configured to retract the member in the case of a system error.

39. Apparatus according to claim 34, wherein the seal comprises a hydrostatic or hydrodynamic bearing and the controller is configured to control the actuator to exert a pre-tension force on the bearing.

40. Apparatus according to claim 22, wherein an inlet of the member, an outlet of the member, or both has rounded edges.

41. Apparatus according to claim 22, wherein an edge of the member adjacent to a surface of the substrate is rounded.

42. A device manufacturing method comprising:
providing a liquid to a space between a projection system of a lithographic apparatus and a substrate, the space being bounded at least in part by a member;
supplying a liquid between the member and the substrate to form a liquid seal between the substrate and the member; and
projecting a patterned radiation beam, using the projection system, through the liquid onto a target portion of the substrate.

43. Method according to claim 42, further comprising:
establishing a distance between a surface of the substrate and the member; and
controlling an actuator to maintain a desired distance between the surface of the substrate and the member based on the established distance.

44. Method according to claim 42, wherein the seal comprises either a hydrostatic or a hydrodynamic bearing to at least partially support the member above a surface of the substrate.

45. Method according to claim 42, further comprising preventing leakage of liquid in an outward radial direction by removing liquid, gas, or both using a low pressure outlet located on a surface of the member which faces the substrate.

46. A device manufacturing method comprising:
providing a liquid to a space between a projection system of a lithographic apparatus and a surface of the substrate, the liquid being provided via a liquid inlet and extracted via a separate liquid outlet, adjacent said liquid inlet, the liquid inlet provided on a member and facing the surface of the substrate, and the liquid inlet and the liquid outlet provided on a same side of the projection system; and
projecting a patterned radiation beam, using the projection system, through the liquid onto a target portion of the substrate.

47. Method according to claim 46, further comprising:
establishing a distance between a surface of the substrate and the member; and
controlling an actuator to maintain a desired distance between the surface of the substrate and the member based on the established distance.

48. Method according to claim 46, further comprising preventing leakage of liquid in an outward radial direction by removing liquid, gas, or both using a low pressure outlet located on a surface of the member which faces the substrate.

* * * * *